(12) United States Patent
Linford et al.

(10) Patent No.: US 11,946,819 B2
(45) Date of Patent: Apr. 2, 2024

(54) TRANSIENT PRESSURE EVENT DETECTION SYSTEM AND METHOD

(71) Applicant: Syrinix Ltd, Norwich (GB)

(72) Inventors: Paul Linford, Norwich (GB);
Benjamin Smither, Norwich (GB);
Alexander Forbes, Norwich (GB);
Emiliano Rustighi, Southampton (GB);
Paul White, Southampton (GB);
Jennifer Muggleton, Southampton (GB)

(73) Assignee: Syrinix Ltd, Norfolk (GB)

( * ) Notice: Subject to any disclaimer, the term of this patent is extended or adjusted under 35 U.S.C. 154(b) by 499 days.

(21) Appl. No.: 17/215,987

(22) Filed: Mar. 29, 2021

(65) Prior Publication Data

US 2022/0042872 A1  Feb. 10, 2022

(30) Foreign Application Priority Data

Aug. 4, 2020 (GB) .................................... 2012089

(51) Int. Cl.
  *G01L 23/26* (2006.01)
  *G06F 30/18* (2020.01)
  *G06F 30/20* (2020.01)

(52) U.S. Cl.
  CPC .............. *G01L 23/26* (2013.01); *G06F 30/18* (2020.01); *G06F 30/20* (2020.01)

(58) Field of Classification Search
  None
  See application file for complete search history.

(56) References Cited

U.S. PATENT DOCUMENTS

| 3,664,357 A | 5/1972 | Kreis |
| 4,356,444 A | 10/1982 | Saenz, Jr. |

(Continued)

FOREIGN PATENT DOCUMENTS

| CN | 208237498 | 12/2018 |
| CN | 109635501 A | 4/2019 |

(Continued)

OTHER PUBLICATIONS

S. Srirangarajan and D. Pesch, "Source localization using graph-based optimization technique," 2013 IEEE Wireless Communications and Networking Conference (WCNC), Shanghai, China, 2013, pp. 1127-1132, doi: 10.1109/WCNC.2013.6554722. (Year: 2013).*

(Continued)

*Primary Examiner* — Raymond L Nimox
(74) *Attorney, Agent, or Firm* — Leason Ellis LLP

(57) ABSTRACT

A transient pressure event detection system and method for a pipeline network are disclosed. The system includes a data repository encoding route data on the pipeline network, a data receiver configured to receive timestamped pipeline sensor data from each of a plurality of sensors that are spaced apart in the pipeline network, use the sensor data received to identify a transient pressure event occurrence and the timestamp for the event occurrence's arrival time, determine routes in the pipeline network between the sensors, for each route determine a potential source location in the pipeline network for the transient pressure event, perform a simulated transient event for each potential source location and determine a modelled arrival time of a transient corresponding to the event, compare the timestamp of the event occurrence with the modelled arrival time and select the potential source location corresponding to the closest modelled arrival time.

20 Claims, 7 Drawing Sheets

(56) References Cited

U.S. PATENT DOCUMENTS

| | | | |
|---|---|---|---|
| 4,516,206 A | 5/1985 | McEvilly | |
| 4,609,994 A | 9/1986 | Bassim et al. | |
| 4,977,529 A | 12/1990 | Gregg et al. | |
| 5,333,501 A | 8/1994 | Okada et al. | |
| 5,987,990 A | 11/1999 | Worthington et al. | |
| 6,082,193 A | 7/2000 | Paulson | |
| 6,212,133 B1 | 4/2001 | McCoy et al. | |
| 6,253,624 B1 | 7/2001 | Broden et al. | |
| 6,453,247 B1 | 9/2002 | Hunaidi | |
| 7,470,060 B1 | 12/2008 | Hoben et al. | |
| 9,395,262 B1* | 7/2016 | Kumar | G01M 3/2815 |
| 2005/0246112 A1* | 11/2005 | Abhulimen | G01M 3/2815 |
| | | | 73/40 |
| 2006/0005635 A1 | 1/2006 | Breen et al. | |
| 2006/0225507 A1 | 10/2006 | Paulson | |
| 2008/0047329 A1 | 2/2008 | Breed | |
| 2008/0143344 A1 | 6/2008 | Focia et al. | |
| 2008/0314122 A1 | 12/2008 | Hunaidi et al. | |
| 2009/0000381 A1 | 1/2009 | Allison | |
| 2010/0011869 A1 | 1/2010 | Klosinski et al. | |
| 2011/0156957 A1 | 6/2011 | Waite et al. | |
| 2017/0003200 A1* | 1/2017 | McDowell | G01M 3/2815 |
| 2022/0002984 A1* | 1/2022 | Rossi | E03B 7/075 |

FOREIGN PATENT DOCUMENTS

| | | |
|---|---|---|
| EP | 2006654 | 12/2008 |
| EP | 2314997 | 4/2011 |
| GB | 2491804 A | 12/2012 |
| JP | 11064151 | 3/1999 |
| JP | 2004117174 | 4/2004 |
| RU | 2190152 | 9/2002 |
| WO | 2009129959 | 10/2009 |
| WO | 201007637 A2 | 9/2010 |
| WO | 2012153147 A1 | 11/2012 |

OTHER PUBLICATIONS

I. Stoianov, L. Nachman, S. Madden, T. Tokmouline and M. Csail, "PIPENET: A Wireless Sensor Network for Pipeline Monitoring," 2007 6th International Symposium on Information Processing in Sensor Networks, Cambridge, MA, USA, 2007, pp. 264-273, doi: 10.1109/IPSN.2007.4379686. (Year: 2007).*

T. T. T. Zan, H. B. Lim, K.—J. Wong, A. J. Whittle and B.—S. Lee, "Event Detection and Localization in Urban Water Distribution Network," in IEEE Sensors Journal, vol. 14, No. 12, pp. 4134-4142, Dec. 2014, doi: 10.1109/JSEN.2014.2358842. (Year: 2014).*

* cited by examiner

TRANSIENT PRESSURE EVENT DETECTION SYSTEM AND METHOD

CROSS-REFERENCE TO RELATED APPLICATION

This application claims priority to GB Patent Application No. 2012089.5 filed Aug. 4, 2020, the contents of which are incorporated by reference in its entirety as if set forth herein.

FIELD OF THE INVENTION

The present invention relates to a transient pressure event detection system and method that is particularly applicable to detection and location of hydraulic events and/or determination of the source of hydraulic transient events in water networks and other complex liquid content pipeline networks.

BACKGROUND TO THE INVENTION

Pipeline networks tend to have complex layouts and are often modified and extended over time. Monitoring such networks can be challenging, although efficient and precise monitoring is very important for their management and for proactive maintenance.

Pressure transients have been known about for about 200 years and the mathematics which describes the physics of the phenomena for about 100 years. However, the negative consequences of these short term, large amplitude, pressure events in a pipeline network have only been properly appreciated within the last 30 years and the technology to fully capture and understand has only been available within the last ten years. Work to fully understand the mechanisms through which pressure transients and other pressure fluctuations degrade pipeline lifetime is ongoing and remains a research topic in engineering and materials science.

Determining the location of a transient source in a pipeline network is a different problem to free space (in the sea for example) because the constrained pipeline route in an interconnected network gives multiple solutions. Mixed media, i.e. different pipeline materials in the same network that have different wave-propagation speeds, add complexity.

Current systems are unable to quickly and automatically detect the source of a transient event—this is often not possible at all in present pipeline networks and where it is done, it is typically performed manually by an expert.

STATEMENT OF THE INVENTION

According to an aspect of the present invention, there is provided a transient pressure event detection system for a pipeline network comprising:
 a data repository encoding route data on the pipeline network;
 a data receiver configured to receive pipeline sensor data from each of a plurality of sensors that are spaced apart in the pipeline network, the pipeline sensor data from each sensor being timestamped;
 an event detecting unit configured to:
 i) receive the pipeline sensor data from the data receiver;
 ii) determine, from the sensor data received from each of at least two of the sensors, in respect of each of the at least two sensors, a transient pressure event occurrence and the timestamp for the event occurrence's arrival time;
 iii) for all pairings of the sensors having a transient pressure event occurrence, determine, from the data repository, routes in the pipeline network between the sensors of the sensor pairing;
 iv) determine, for each route and in dependence on difference in timestamps of the respective sensors, a potential source location in the pipeline network for the transient pressure event;
 v) perform a simulated transient event for each potential source location and determine a modelled arrival time of a transient corresponding to the event at each of the at least two sensors;
 vi) compare the timestamp of the event occurrence for each of the at least two sensors with the modelled arrival time and select the potential source location corresponding to the closest modelled arrival time.

Embodiments of the present invention seek to identify one or more of source and route of a transient event. In preferred embodiments, a scoring or weighting system is used to analyze data received from sensors in the pipeline.

Preferably, possible routes and secondary routes in the pipeline network are computed for a transient event that has been detected by two or more sensor units that are spaced apart in the pipeline. In one embodiment, all possible routes are computed. In one embodiment, data on the pipeline is obtained and translated into a search tree with each possible route being represented by branches in the tree. Sensor position is also included in the tree. In one embodiment, the search tree is processed to identify all possible routes for a transient event. In another embodiment, the search tree is processed based on a heuristic or other weighted algorithm to identify all routes for a transient event that meet the heuristic or other weighting criteria.

Once possible routes and possible source locations have been identified, an event is then simulated by the system. Preferably, the system simulates an event (preferably in a hydraulic network model) at each possible candidate event and propagated out to all sensors in the network including the two (or more) sites that detected the real event plus all other units in the network. This gives a distribution of theoretical arrival times at the sensor sites. The system then compares (in one embodiment using a least squares score) with the actual observed arrival times received by the sensors. The lowest scores are the most likely candidates.

Optionally, weightings and multipliers may be used to favor measurement sites that are closer together. When there are a wide variety of distances in the family of available sensor sites a limit to the minimum distance may be applied, for example 2 km.

Mixed pipeline materials along a leg of a network (due to repair, for example) add further complexity and in an optional embodiment, an approach has been developed to search along the pipe length stepping through each section as it is encountered.

Preferred embodiments are based upon differential arrival times of the transient pressure signal at each monitoring site. Onset detection, which is the determination of the start of the pressure transient, is therefore used in preferred embodiments to set the delta-times of arrival between different sites.

Preferably, two approaches are used in tandem to automatically determine the onset time for a pressure transient.
 a) Filtered derivatives, a robust process that is particularly successful for large events in the pressure data stream.
 b) Use of a short time-window correlation algorithm that has been developed as a solution to the challenge of spotting smaller onsets.

Preferably, approach b is used to supplement approach a.

The time-window in which transient onsets could be found at sites B, C, D etc., given the existence of one at site A is limited by the travel times from A to B, A to C and so on that bounds the signal time that needs to be searched.

When events are simulated, as described earlier, the amplitude decay as the transient moves through the pipe network is also modelled and this limits the range at which possible candidate source locations are considered. Some monitoring sites are therefore theoretically possible source locations (based upon time) but are practically impossible because the amplitude decay is too large and the onset cannot be found within the pressure data stream.

One issue is that as the network size increase, and there are more sensor sites, the computational complexity increases rapidly (substantially exponentially). Although this can be done computationally on demand, in a preferred embodiment the system pre-computes the arrival-time/attenuation values for all pipe sections in the network to a certain granularity, stores these in a database and when that section is part of a route, uses these values by simply looking them up from the database. The section length may be 50 m, for example (but could be less). Use of this technique allows use of scale-able computing resources such as cloud based compute-on-demand systems. These have the advantage that use of the computing resource can be scaled as needed. One such example computing resource that might be used is the Amazon lambda function.

BRIEF DESCRIPTION OF THE DRAWINGS

Embodiments of the present invention will now be described by way of example only and with reference to the accompanying drawings in which.

DETAILED DESCRIPTION

Figure 1:
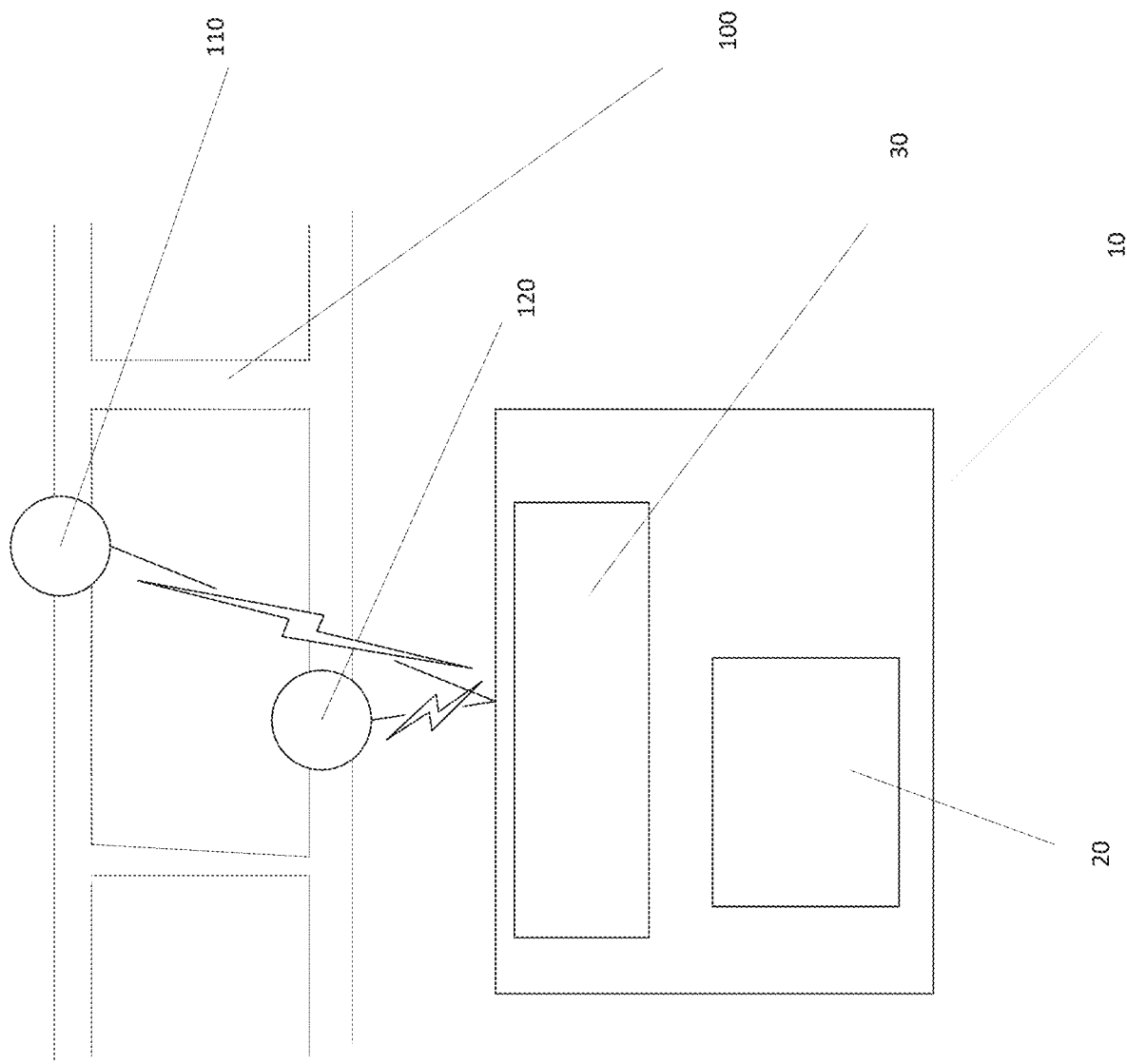
FIG. 1 is a schematic diagram of a transient pressure event detection system according to an embodiment.

FIG. 1 is a schematic diagram of a transient pressure event detection system according to an embodiment of the present invention.

The transient pressure event detection system 10 is for a pipeline network 100. The system includes a data repository 20 encoding route data on the pipeline network, a data receiver 30 configured to receive pipeline sensor data from each of a plurality of sensors 110, 120 that are spaced apart in the pipeline network 100. The pipeline sensor data from each sensor is timestamped by the sensor (each sensor's timing source is preferably synchronized to a common source). In this manner, when an event is present in the sensor data, it will have a corresponding timestamp relative to the timing source of the sensor.

Figure 2:
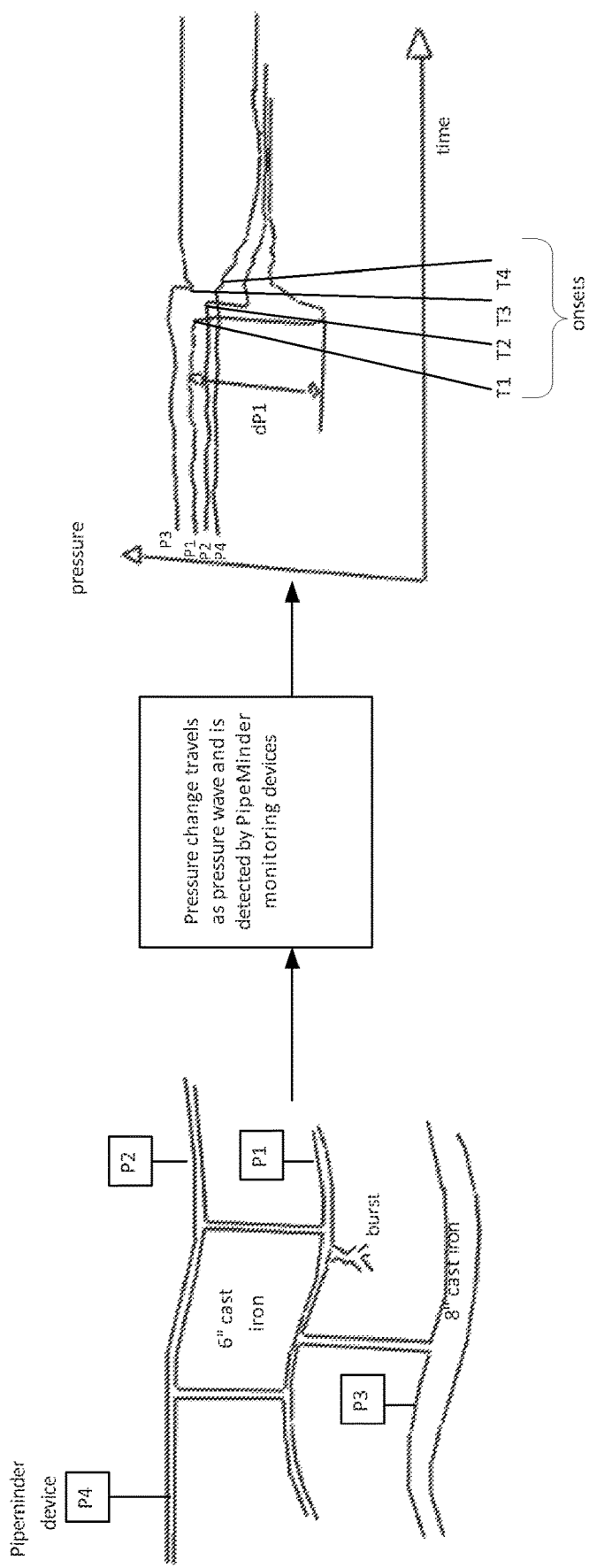
FIG. 2 is a schematic diagram illustrating operation of an embodiment of the present invention.

FIG. 2 is a schematic diagram illustrating operation of an embodiment of the present invention.

The transient pressure event detection system is configured as described in FIG. 1 above. The sensors may be dedicated to this system or may be part of other sensors or components tasked with performing other functions. It will be appreciated that the sensors could be provided separately to the transient pressure event detection system 10.

In this embodiment a greatly simplified (for purposes of explanation) pipeline network 100 is illustrated with two pressure sensors installed in direct contact with the water column. A transient event occurs at position labelled "A" and a pressure transient propagates through the network 100. Sensor 110 detects the transient and communicates this (for example via a wireless network, mobile phone network, or PSTN etc.) to the system 10. If the transient event is detected at the second sensor 120, it too will send data reporting this to the system 10. If not, the system 10 may poll each sensor in the network asking for its data in order to trace the event.

As an alternative to the push model of data delivery, sensors may continuously or periodically send data to the system whether or not anything is detected and this data may then be searched for events.

The system processes the sensor data to match sensor data from the first sensor 110 to sensor data of the second sensor 120 for the event. It does so by:

a) determining, from the sensor data from each sensor a transient pressure event occurrence and the timestamp for the event occurrence.

b) determining, from the data repository 20, routes between the sensors 110, 120. It will be appreciated that there will be many routes, some longer than others and each of these (subject optionally to constraints discussed previously) are recorded as a possible route.

c) determining, for each route and in dependence on difference in timestamps of the respective sensors, a potential source location in the pipeline network for the transient pressure event. This may be done pairwise for sensors (based on all possible pairings) or some more heuristic approach to selecting relevant pairings, it may also be based on a triangulation approach or similar using more than two sensors;

d) performing a simulated transient event at each potential source location and for all sensors in the network determine a theoretical arrival time of a transient corresponding to the event;

e) comparing the timestamp of the event occurrence for each sensor with the theoretical arrival time and selecting the route and source corresponding to the closest theoretical arrival times.

Figure 3:
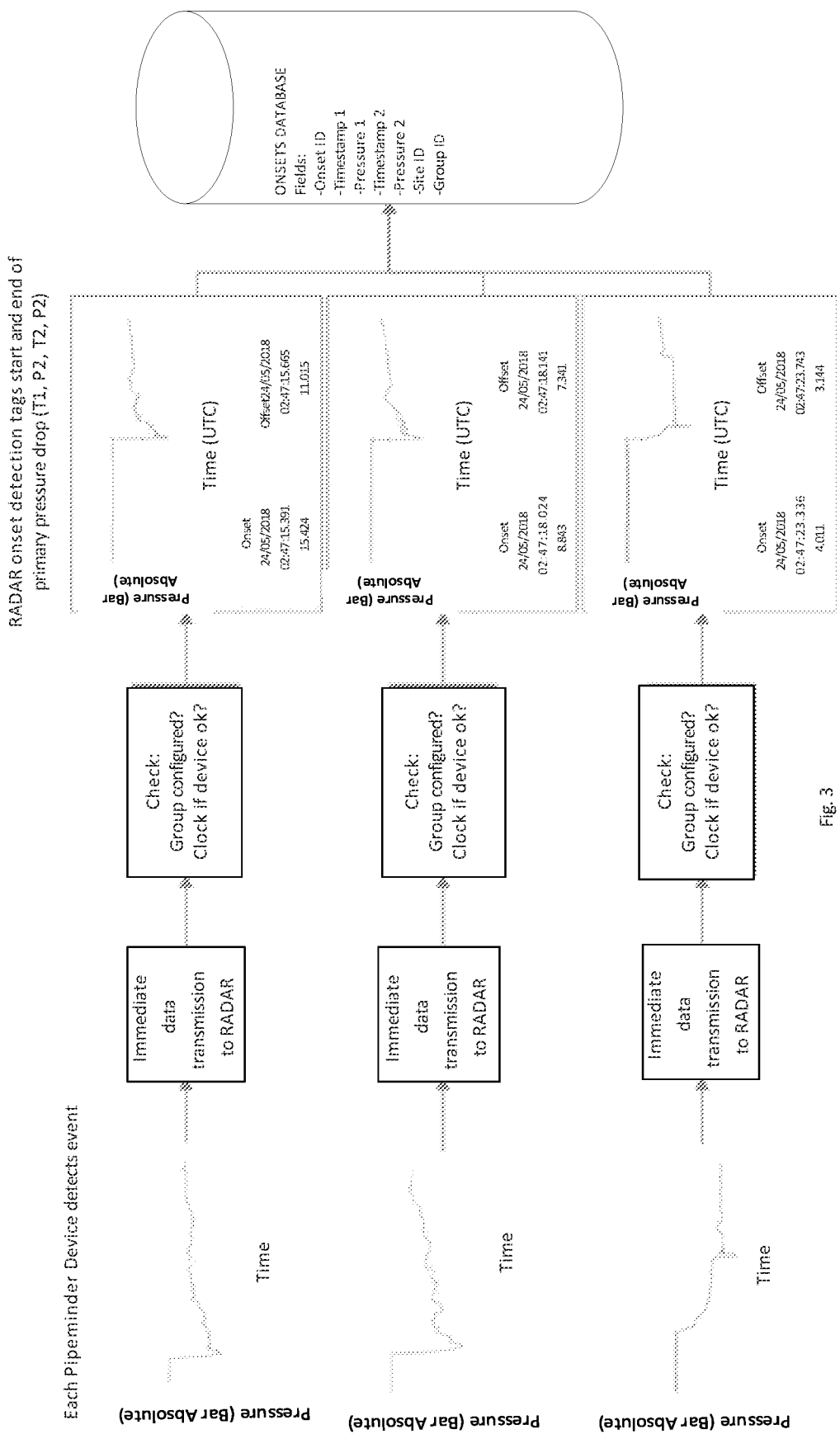
FIG. 3 shows the steps to create the onset database.

FIG. 3 shows the steps to create the onset database. The important points (Onset time, T1, Initial pressure P1, First Drop time T2, First Drop pressure P2) are noted with dots on the pressure waveform.

Figure 4:
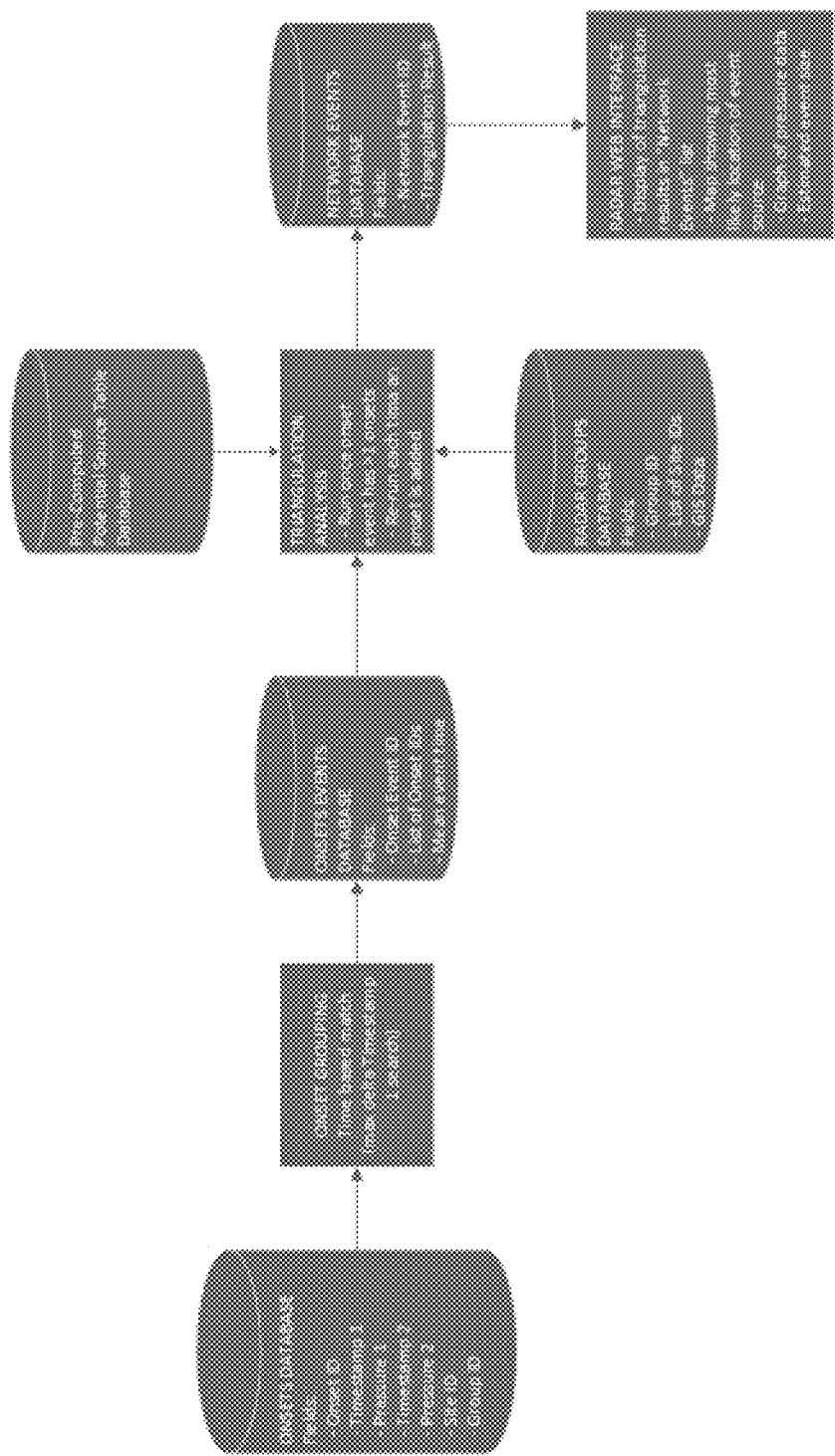
FIG. 4 shows the processing train from the events database to the delivery of the result.

FIG. 4 shows the processing train from the events database to the delivery of the result. An event being written into the events database is a trigger which sets off the subsequent processing train. Not shown in the diagram is a step which, for each event received, checks the database for events from other monitors in the same hydraulic group and then within the time interval which would indicate that it could be the same event. Once there are at least two coincident events, the triangulation process is run. If another event is then added which would have belonged to this group, the analysis is re-run as this may refine the result further. There is no upper limit on how many times this re-computation can occur.

More Detail on the Algorithm and Computational Steps

The algorithm preferably includes the following steps:

1. Route information may optionally be pre-computed for a pipeline or pipeline section from a database such as a GIS (Geographic Information System) database. This can be done offline (typically once or at periodic intervals to capture pipeline changes) and is then be stored in a data repository such a "potential sites database" for a particular network. Pre-computed route information may optionally also include pre-computed timing of events from particular points in the network and this can be used in place of real-time computation when identifying potential source locations of an event.

2. A transient event is detected by one or more sensors (monitoring units)

3. If there are more sensors on the same hydraulic network, pressure data is requested from them, if they have not auto-detected and reported the event, for a long enough segment to ensure the transient must be present.

4. The onset points for the transient event are tagged in the received data for each sensor.

5. The delta-times are computed.

6. The hydraulic model for the network is used to create a list of potential delta-times, preferably taking into account pipeline materials. This step would be skipped if the pre-computation of potential sites (step 1) had been done for the network in question. Having the potential sites database available significantly speeds up the computation of a new source location but creating it is computationally expensive (but only done once).

7. The potential delta times are used to determine potential sources of the transient event in the network;

8. A pressure transient event is simulated for each potential source and a simulated arrival time is determined for each sensor;

7. Least-squares scoring is applied to create a list of most likely candidate solutions for the source of the transient.

8. The scores are optionally weighted to correct for sites close together.

9. The most likely candidate source location is presented as the source location based on scoring.

GIS Data Preparation:

A GIS is typically a mapping system or data repository that holds additional data (layers) beyond just the topographic map. In this case the location and route of pipelines and their important characteristics—size, material, age, and so on. GIS data may be obtained, for example, from the owner of the pipeline or public records. This is unlikely to be in a form that is usable or include all information needed for the algorithm set out above. It therefore would typically be filtered and pre-processed for storage locally for subsequent use. The pre-processing steps may include:

1. Load GIS data and extract key parameters for each pipe section into a structure called PIPES. For each pipe section, PIPES contains:
   a. coordinate path (define path of pipe section)
   b. diameter
   c. length
   d. material
   e. wave speed (propagation velocity of a pressure wave in this pipe section, dependent upon material, size, wall thickness and similar. This may be computed or known empirically).
   f. dT (time for pressure wave to travel through pipe)

2. Split PIPES entries which have a PM-S monitoring device installed onto them at the monitoring point; re-calculate PIPES entry for the two resulting sections.

3. Split pipes at locations of known closed valves; again recalculate lengths

4. Search through the list of pipes and identify pipes with coincident starts and ends. From this, generate a list (structure) of nodes; each node entry has:
   a. A coordinate (e.g. latitude and longitude)
   b. A list of pipes starting or ending at that node (cross referenced by index to the PIPES structure)
   c. A list of nodes which each pipe links to
   d. The cost (time) of travelling along each link
   Note: pipes which stop (i.e. don't connect to others) have nodes placed on the end.

5. Generate a list of nodes called SITENODES which are coincident with the PM-S installation sides 6. Generate a list of nodes called CLOSEDVALVENODES which are coincident with known closed valves because these represent closed paths.

Pressure Transient Event Data—Onset Detection:

A preferred way of detecting transient events is via onset detection.

1. Determine the onset time and pressure of the pressure wave at each PM-S installation point (site). (short term correlation and filtered derivative methods)

2. Determine the first drop time and pressure (this is the lowest pressure point following the onset before there is any recovery).

3. Record this 4-tuple for each site as a structure called RESULTS in the Onset Database.

Calculating Possible Sources (which May be Pre-Computed and Stored in the Potential Sites Database):

1. For each pair of sensor sites in the results structure:
   i. Find the time of arrival difference (dT=ta−tb)
   ii. Find the fastest route between the two sites (minimize travel time) using Dijkstra's algorithm:
   iii. When doing the analysis mark the CLOSEDVALVENODES as visited; this prevents the algorithm routing through them (as they are closed nodes).
   iv. Also pass into the process a list of pipe sections to ignore in the initial, first pass, analysis by artificially increase their cost; this is used later to find secondary route(s).
   v. Store the route as a pipeChain (list of pipe ID's traversed) and nodeChain (list of nodes visited)
   vi. Run the Multi-Material source ID (see section below)—this uses the pipeChain and the dT to calculate a source position for the event.
   vii. Re-run the analysis with the cost of the calculated pipe section artificially increased; this is to find secondary solutions
   viii. Continue running until no more solution/routes are possible for this site pair 2. The above analysis will generate a list of possible sources locations for each site pair.

Calculate the Most Likely Source:

1. Add a node for each of the possible source location
2. Simulate a pressure transient event for each of the possible sources
3. Calculate all of the inter-site time differences for each simulated event
4. Calculate all of the inter-site time differences for the original event
5. Use a "sum of the errors squared" cost function to decide which simulated event is the best match (lowest cost, or most likely) to the original event. Report this to the user as the most likely source location via a map with the GIS overlay.

As discussed above, transient events are preferably detected by onset detection. While there are a number of ways to perform this, a preferred approach is set out below.

The approach described below can work straight from pressure streams data if supplied by a sensor. The amount of data requested/provided from a sensor corresponds to a set amount of time either side of an event—this can be easily updated or automated if the pressure streams cannot be supplied automatically. It does not matter which pressure stream is used as the reference however the change in pressure which is largest and has the highest rate of change is almost always the first pressure stream to detect the event, and this stream is preferably used to maximize effectiveness of the algorithm.

Figure 5:
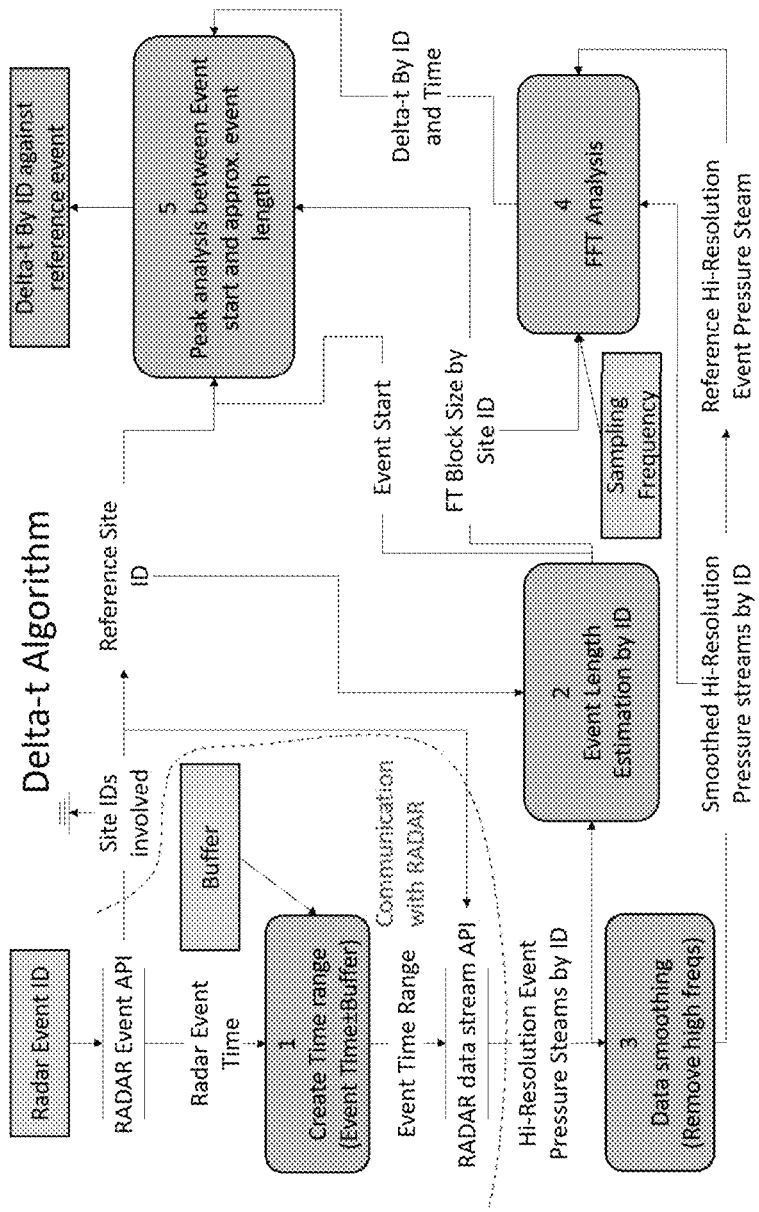
FIG. 5 is a data flow diagram of an onset detector algorithm.

In the data flow diagram of FIG. 5 it can be seen that the only data the algorithm requires are the pressure streams sorted by ID, the ID for the reference stream and a list of the stream IDs. In one embodiment, the sampling frequency is 128 sps (Samples per second)—however in future, should this need to be changed to improve resolution or reduce data communication overhead for example, it would be easy to update. The IDs of the sites involved are used by every process as the ID for the pressure streams. This is necessary for the processing of all pressure streams simultaneously however in order to process two streams (reference and incident pressure streams) all that is required is a reference to which stream is which. The process remains the same no matter whether processing two or more streams. Given this, the data flow will be described from getting the pressure streams assuming the streams are referenced by Site ID.

Figure 6:
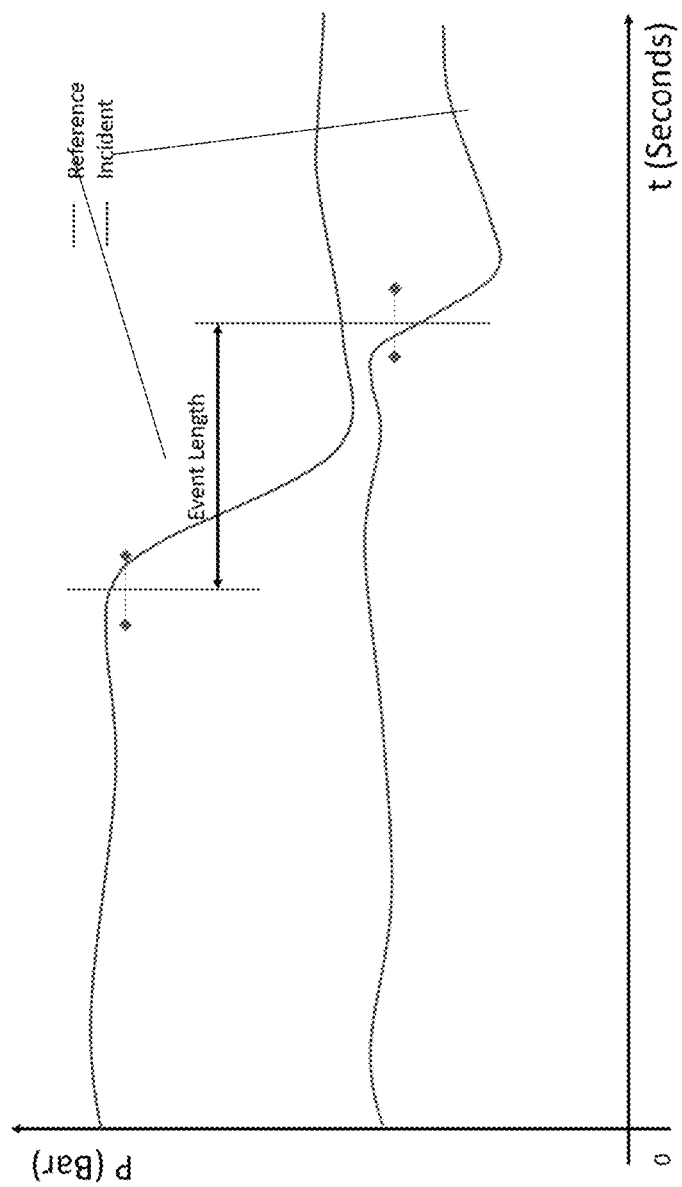
FIG. 6 is a graphical representation of an event length.

The algorithm begins by getting an estimate of the event length for each data stream. This has a far too high inaccuracy to be used as the final calculation however it does help the Fourier calculation later in providing a more reasonable block size than the full data stream or a one-size-fits-all number. See FIG. 6 for a graphical representation of the event length estimate.

After this, the raw data stream is smoothed in order to remove any high frequencies. This helps the FFT (Fast Fourier Transform) later to pick out the large, low frequency pressure drop without the pressure drop being drowned out by large but fast oscillations. The amount of smoothing is based on the frequencies commonly found in transients which does not reduce the sharp edge on the pressure drop too much. Too much smoothing on the onset of the pressure drop muffles the overall accuracy of the detector.

After smoothing, the reference pressure stream, the incident pressure streams, the block size for each of the incident streams (Calculated as the event length+a small buffer length to make sure the whole event is captured), and the sampling frequency are then passed into the FFT analysis package.

Figure 7:
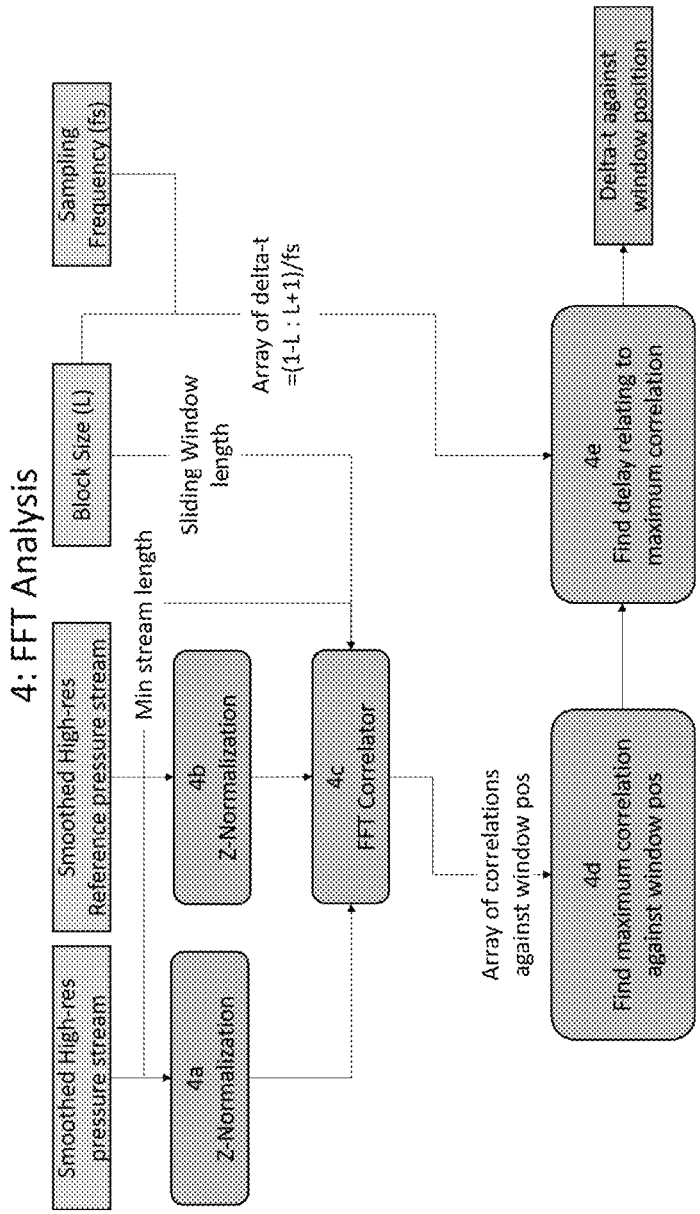
FIG. 7 is a data flow diagram for a FFT Analysis Algorithm

In FIG. 7, it can be seen how the analysis works. Firstly, the length of the two data streams are taken. Just in case they happen to not be the same length, the smallest length is taken. Both data streams are z-normalized and passed into the FFT Correlator, along with the Block Size. This loops through both pressure streams using a sliding window which is block size length. The FFT is taken of the window for both the Reference ($FFT_R$) and Incident ($FFT_I$) pressures using their respective block sizes. The $FFT_R$ is then element-wise multiplied with the complex conjugate of $FFT_I$. The resulting Fourier Transform is then normalized and the window shifted. The process repeated until the end of the sliding window reaches the end of the pressure stream.

Taking the array created, the maximum of each window is found. The position of this maximum correlates to a delay and this is found in the "Array of delta-t" shown in 8. These delays and the respective position of the window is returned to the overall algorithm.

Peak analysis is then performed on the returned array and between the event start and event end (shown on FIG. 7).

Due to the nature of the analysis, the delay between the two onsets is highly likely to be the first peak found in this range.

This peak in the returned array is the calculated delta-t for the two pressure streams involved in the analysis.

It is to be appreciated that certain embodiments of the invention as discussed above may be incorporated as code (e.g., a software algorithm or program) residing in firmware and/or on computer useable medium having control logic for enabling execution on a computer system having a computer processor. Such a computer system typically includes memory storage configured to provide output from execution of the code which configures a processor in accordance with the execution. The code can be arranged as firmware or software, and can be organized as a set of modules such as discrete code modules, function calls, procedure calls or objects in an object-oriented programming environment. If implemented using modules, the code can comprise a single module or a plurality of modules that operate in cooperation with one another.

Optional embodiments of the invention can be understood as including the parts, elements and features referred to or indicated herein, individually or collectively, in any or all combinations of two or more of the parts, elements or features, and wherein specific integers are mentioned herein which have known equivalents in the art to which the invention relates, such known equivalents are deemed to be incorporated herein as if individually set forth.

Although illustrated embodiments of the present invention have been described, it should be understood that various changes, substitutions, and alterations can be made by one of ordinary skill in the art without departing from the present invention which is defined by the recitations in the claims and equivalents thereof.

The invention claimed is:

1. A transient pressure event detection system for a pipeline network comprising:
    a data repository encoding route data on the pipeline network;
    a data receiver configured to receive pipeline sensor data from each of a plurality of sensors that are spaced apart in the pipeline network, the pipeline sensor data from each sensor being timestamped;
    an event detecting unit including a processor and a non-transitory memory and being configured to execute computer program code to:
        i) receive the pipeline sensor data from the data receiver;
        ii) determine, from the sensor data received from each of at least two of the sensors, in respect of each of the at least two sensors, a transient pressure event occurrence and the timestamp for the event occurrence's arrival time;
        iii) for all pairings of the sensors having a transient pressure event occurrence, determine, from the data repository, routes in the pipeline network between the sensors of the sensor pairing;
        iv) determine, for each route and in dependence on difference in timestamps of the respective sensors, a potential source location in the pipeline network for the transient pressure event;
        v) perform a simulated transient event for each potential source location and determine a modelled arrival time of a transient corresponding to the event at each of the at least two sensors;
        vi) compare the timestamp of the event occurrence for each of the at least two sensors with the modelled arrival time and selecting the potential source location corresponding to the closest modelled arrival time.

2. The system of claim 1, wherein the event detecting unit is configured to compute routes in the pipeline network between the sensors from data on the pipeline network in the data repository.

3. The system of claim 1, wherein the event detecting unit is configured to look up routes in the pipeline network between the sensors from pre-computed routes stored in the data repository.

4. The system of claim 1, wherein the event detecting unit is further configured to translate data on the pipeline into a search tree with each possible route being represented by branches in the tree.

5. The system of claim 4, wherein the event detecting unit is configured to process the search tree to identify all possible routes for a transient event.

6. The system of claim 1, wherein the event detecting unit is configured to simulate the event in a hydraulic network model at each potential source location, the simulation including simulating propagation of a pressure transient from the potential source location to all sensors in the network to obtain a distribution of theoretical arrival times at the sensor locations.

7. The system of claim 1, wherein the event detecting unit is further configured to apply a weighting to favor measurement sites that are closer together in the pipeline network.

8. The system of claim 1, wherein the data repository storing data on pipeline materials within the pipeline network, the event detecting unit being configured to search along the pipe length stepping through each section as it is encountered.

9. The system of claim 1, wherein the data repository storing pre-computed data arrival-time/attenuation values each pipe section of the pipeline network, the event detecting unit being configured to use the pre-computed data when performing the simulated transient event.

10. The system of claim 1, wherein the event detecting unit is configured to apply, during the simulation, simulated amplitude decay as the transient moves through the pipe network to limits the range at which possible candidate source locations are considered.

11. The system of claim 1, wherein the event detecting unit is configured to determine the onset time for a pressure transient.

12. The system of claim 11, wherein the event detecting unit is configured to filter derivatives to determine the onset time for a pressure transient.

13. The system of claim 11, wherein the event detecting unit is configured to filter apply a short time-window correlation algorithm to determine the onset time for a pressure transient.

14. A method for detecting transient pressure events in a pipeline network comprising:

storing, in a data repository, route data on the pipeline network;

receiving, at a data receiver, pipeline sensor data from each of a plurality of sensors that are spaced apart in the pipeline network, the pipeline sensor data from each sensor being timestamped;

at an event detecting unit:
  i) receiving the pipeline sensor data from the data receiver;
  ii) determining, from the sensor data received from each of at least two of the sensors, in respect of each of the at least two sensors, a transient pressure event occurrence and the timestamp for the event occurrence's arrival time;
  iii) for all pairings of the sensors having a transient pressure event occurrence, determining, from the data repository, routes in the pipeline network between the sensors of the sensor pairing;
  iv) determining, for each route and in dependence on difference in timestamps of the respective sensors, a potential source location in the pipeline network for the transient pressure event;
  v) performing a simulated transient event for each potential source location and determine a modelled arrival time of a transient corresponding to the event at each of the at least two sensors;
  vi) comparing the timestamp of the event occurrence for each of the at least two sensors with the modelled arrival time and selecting the potential source location corresponding to the closest modelled arrival time.

15. The method of claim 14, step iii) further comprising computing routes in the pipeline network between the sensors from data on the pipeline network in the data repository.

16. The method of claim 14, further comprising pre-computing routes between sensors, storing the pre-computed routes in the data repository, and step iii) further comprising looking up the pre-computed routes.

17. The method of claim 14, further comprising translating data on the pipeline into a search tree with each possible route being represented by branches in the tree.

18. The method of claim 17, further comprising processing the search tree to identify all possible routes for a transient event.

19. The method of claim 14, further comprising simulating the event in a hydraulic network model at each potential source location, the simulation including simulating propagation of a pressure transient from the potential source location to all sensors in the network to obtain a distribution of theoretical arrival times at the sensor locations.

20. The method of claim 14, further comprising applying a weighting to favor measurement sites that are closer together in the pipeline network.

* * * * *